US012682956B2

(12) United States Patent
Lien et al.

(10) Patent No.: US 12,682,956 B2
(45) Date of Patent: ***Jul. 14, 2026

(54) BITLINE VOLTAGE ADJUSTMENT FOR PROGRAM OPERATION IN A MEMORY DEVICE

(71) Applicant: Micron Technology, Inc., Boise, ID (US)

(72) Inventors: Yu-Chung Lien, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 91 days.

This patent is subject to a terminal disclaimer.

(21) Appl. No.: 18/527,658

(22) Filed: Dec. 4, 2023

(65) Prior Publication Data

US 2024/0203502 A1 Jun. 20, 2024

Related U.S. Application Data

(60) Provisional application No. 63/432,930, filed on Dec. 15, 2022.

(51) Int. Cl.
*G11C 16/10* (2006.01)
*G11C 16/26* (2006.01)
*G11C 16/34* (2006.01)

(52) U.S. Cl.
CPC .............. *G11C 16/10* (2013.01); *G11C 16/26* (2013.01); *G11C 16/3459* (2013.01)

(58) Field of Classification Search
CPC ..... G11C 16/10; G11C 16/26; G11C 16/3459; G11C 16/08; G11C 16/24; G11C 16/0483
See application file for complete search history.

(56) References Cited

U.S. PATENT DOCUMENTS

| | | | |
|---|---|---|---|
| 11,139,031 B1 * | 10/2021 | Chen ................... | G11C 11/5642 |
| 11,139,038 B1 | 10/2021 | Masuduzzaman et al. | |
| 2010/0329010 A1 | 12/2010 | Dong | |
| 2013/0097370 A1 * | 4/2013 | Ito ........................ | G11C 11/5621 |
| | | | 711/103 |
| 2015/0043283 A1 * | 2/2015 | Kwak .................... | G11C 16/10 |
| | | | 365/185.22 |
| 2016/0077753 A1 | 3/2016 | Cometti et al. | |
| 2016/0300621 A1 | 10/2016 | Abe et al. | |
| 2016/0300624 A1 | 10/2016 | Kim | |
| 2017/0178740 A1 | 6/2017 | Kim et al. | |
| 2019/0043591 A1 * | 2/2019 | Fastow .............. | G11C 11/4074 |
| 2019/0198514 A1 | 6/2019 | Kim et al. | |
| 2020/0066363 A1 | 2/2020 | Yang | |
| 2020/0258585 A1 * | 8/2020 | Lee .................... | G11C 16/3445 |
| 2022/0238161 A1 * | 7/2022 | Jang ................... | G11C 16/3459 |
| 2023/0197174 A1 * | 6/2023 | Guo ................... | G11C 16/3459 |
| | | | 365/158 |

* cited by examiner

*Primary Examiner* — Uyen Smet
(74) *Attorney, Agent, or Firm* — Lowenstein Sandler LLP

(57) ABSTRACT

A request to perform a program operation on a set of vertically stacked memory cells of a memory device is received. A bitline voltage adjustment value based on a number of program erase cycles (PECs) associated with the memory device is determined responsive to determining that at least one memory cell of the set of vertically stacked memory cells is non-programmable. A default bitline voltage is adjusted by the bitline voltage adjustment value to generate an adjusted bitline voltage. The program operation on the set of vertically stacked memory cells is performed using the adjusted bitline voltage.

20 Claims, 6 Drawing Sheets

| Logical State(s) 310 | # of PEC 320A | # of PEC 320B | # of PEC 320C | # of PEC 320D | ... | # of PEC 320F |
|---|---|---|---|---|---|---|
| L0 | BVAV0 | BVAV8 | BVAV16 | BVAV24 | ... | BVAV43 |
| L1 | BVAV1 | BVAV9 | BVAV17 | BVAV25 | ... | BVAV44 |
| L2 | BVAV2 | BVAV10 | BVAV18 | BVAV26 | ... | BVAV45 |
| L3 | BVAV3 | BVAV11 | BVAV19 | BVAV27 | ... | BVAV46 |
| L4 | BVAV4 | BVAV12 | BVAV20 | BVAV28 | ... | BVAV47 |
| L5 | BVAV5 | BVAV13 | BVAV21 | BVAV29 | ... | BVAV48 |
| L6 | BVAV6 | BVAV14 | BVAV22 | BVAV30 | ... | BVAV49 |
| L7 | BVAV7 | BVAV15 | BVAV23 | BVAV31 | ... | BVAV50 |

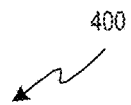

400

Receive a request to perform a program operation on a set of vertically stacked memory cells of a memory device, wherein each memory cell of the set of vertically stacked memory cells is addressable by a respective wordline.

410

Responsive to determining that at least one memory cell of the set of vertically stacked memory cells is non-programmable, determining, based on a number of program erase cycles (PECs) associated with the memory device, a bitline voltage adjustment value.

420

Adjust a default bitline voltage by the bitline voltage adjustment value to generate an adjusted bitline voltage associated with a program verify operation of a program operation.

430

Perform, using the adjusted bitline voltage, the program operation on the set of vertically stacked memory cells.

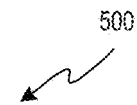
500
Receive a request to perform a program operation on a first block of a memory device, wherein the block includes a non-programmable top deck and a programmable bottom deck.
<u>510</u>
Perform, using an adjusted bitline voltage, the program operation on the first block.
<u>520</u>
FIG. 5

BITLINE VOLTAGE ADJUSTMENT FOR PROGRAM OPERATION IN A MEMORY DEVICE

RELATED APPLICATIONS

This application claims the benefit of U.S. Provisional Patent Application No. 63/432,930, filed Dec. 15, 2022, entitled "BITLINE VOLTAGE ADJUSTMENT FOR PROGRAM OPERATION IN A MEMORY DEVICE," which is incorporated by reference herein.

TECHNICAL FIELD

Embodiments of the disclosure relate generally to memory sub-systems, and more specifically, relate to bitline voltage adjustment for program operation in a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 illustrates an example of a table storing bitline voltage adjustment values for use adjusting a default bitline voltage during a program verify phase of a program operation, in accordance with some embodiments of the present disclosure.

FIG. 4 is a flow diagram of an example method of adjusting the default bitline voltage during a program operation in accordance with some embodiments of the present disclosure.

FIG. 5 is a flow diagram of an example method of adjusting the default bitline voltage during a program operation in accordance with some embodiments of the present disclosure.

DETAILED DESCRIPTION

Figure 1:
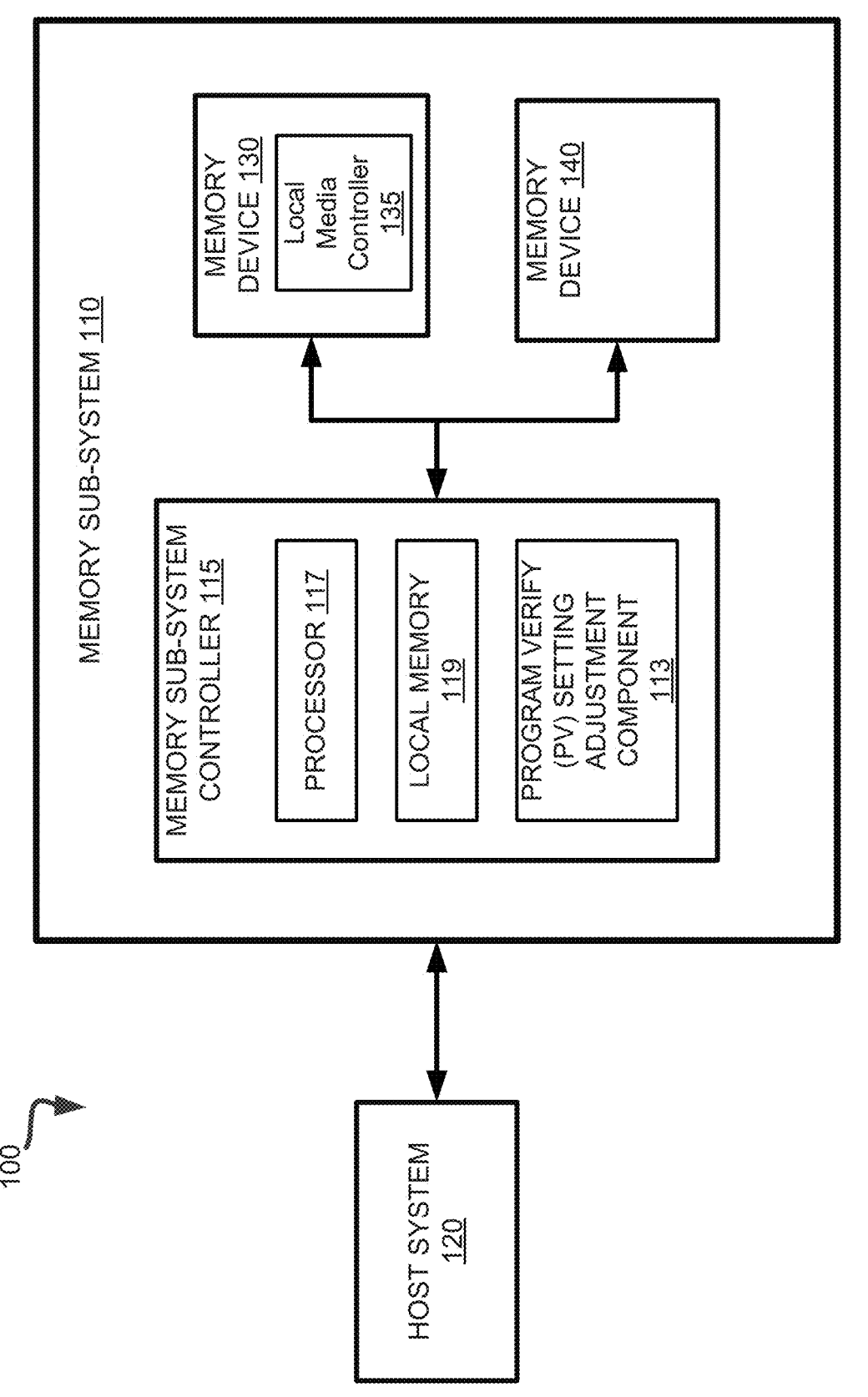
FIG. 1 illustrates an example computing system that includes a memory sub-system in accordance with some embodiments of the present disclosure.

Aspects of the present disclosure are directed to bitline voltage adjustment for program operation in a memory device. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high-density non-volatile memory devices where retention of data is desired when no power is supplied to the memory device. One example of non-volatile memory devices is a not-and (NAND) memory device. Other examples of non-volatile memory devices are described below in conjunction with FIG. 1. A non-volatile memory device is a package of one or more dies. Each die can includes of one or more planes. For some types of non-volatile memory devices (e.g., NAND devices), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched formed onto a silicon wafer in an array of columns (also hereinafter referred to as bitlines) and rows (also hereinafter referred to as wordlines). A wordline can have a row of associated memory cells in a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The cells can, therefore, be characterized by a distribution P of the threshold voltages, $P(Q,V_T)=dW/dV_T$, where dW represents the probability that any given cell has its threshold voltage within the interval $[V_T, V_T+dV_T]$ when charge Q is placed on the cell.

A memory device can exhibit threshold voltage distributions $P(Q,V_T)$ that are narrow compared with the working range of control voltages tolerated by the cells of the device. Accordingly, multiple non-overlapping distributions $P(Q_k, V_T)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A valley margin can also be referred to as a read window. For example, in a SLC cell, there is 1 read window that exists with respect to the 2 $V_t$ distributions. As another example, in an MLC cell, there are 3 read windows that exist with respect to the 4 $V_t$ distributions. As yet another example, in a TLC cell, there are 7 read windows that exist with respect to the 8 $V_t$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows. RWB degradation can negatively affect memory device reliability. For example, RWB degradation can lead to an increase in the number of errors (e.g., bit errors) and/or error rate (e.g., bit error rate (BER)).

Some memory devices, such as, three-dimensional (3D) memory devices (e.g., 3D NAND devices) can include multiple layers or decks. A layer or deck of the memory device can be defined as a two-dimensional (2D) array of memory cells electronically addressable by a vertical access line(s) (e.g., wordline(s)). Multiple decks can be stacked within the memory device (e.g., stacked vertically), thus a unit of the memory device (e.g., a block) may include a memory cell from each deck (e.g., a set of vertically stacked memory cells). As wordlines associated with a deck experiences degradation, such as wordline-to-wordline shorts, open wordlines, or other wordline related issues, the deck of the block may become non-programmable or unusable (e.g., non-functional or defective). The wordline may be placed in a low voltage state (e.g., erased state) to prevent further use of the memory cells of the wordline. Thus, the block may include multiple functional decks (e.g., a fully functional block) or at least one non-functional deck (e.g., a partially functional block).

During a programming operation, a series of incrementally increasing programming pulses are applied to a selected or target wordline associated with a memory cell being programmed, while biasing unselected wordlines associated with the memory cell by applying a pass-through voltage ($V_{pass}$). The series of incrementally increasing programming pulses are used to gradually increase a charge level, and thereby a threshold voltage, of the memory cell associated with the selected wordline. A program verify phase can be performed, after each programming pulse, to determine a threshold voltage of the memory cell resulting from the application of the programming pulse. After programming, the programming level of the memory cell is verified, in effect, by comparing the programming level to a target (i.e., desired) program verify (PV) voltage level. The PV voltage level can be provided by an external reference.

The program verify phase includes applying a ramped voltage to the selected wordline associated with the memory cell being verified, while biasing unselected wordlines associated with the memory cell using $V_{pass}$. When the ramped voltage reaches the threshold voltage to which the memory cell has been programmed, the memory cell turns on and sense circuitry detects a current on a bitline coupled to the memory cell. The detected current activates the sense circuitry to compare whether the present threshold voltage is greater than or equal to the stored target threshold voltage. In particular, the sense circuitry precharges a sense node of the sense circuitry using a program verify level and a bitline using a bitline voltage. If the present threshold voltage detected at the sense node, based on the discharge of the sense node, is greater than or equal to the target threshold voltage, further programming is inhibited. Otherwise, programming typically continues in this manner with the application of additional program pulses to the memory cell until the target PV of a corresponding programming level and data state is achieved.

During read operations a read reference voltage ($V_{ref}$) is applied to a selected or target wordline (WLn) associated with a memory cell to be read (e.g., a read cell) while applying $V_{pass}$ to the unselected wordlines associated with memory cells not being read (e.g., unread cells). Thus, the read cell and unread cells are kept on during the read operation and the sense circuitry is connected to the bitline to sense whether the read cell has been switched on. Accordingly, since the cells of the bitline are connected in series, the output of the read cell may be passed through the unread cells, during read operation, to the sense circuitry. While some partially functional blocks experience increased error rates (e.g., bit error rates (BERs)) using this method of read operations, other partially functional blocks produce accurate read results as a result of an increased string current during program verify phase of the programming operation used to compensate of a read mismatch for later read operations.

As the memory device experiences an increased number of program erase cycles (PECs), the partially functional blocks that produce accurate read results may experience a decrease in RWB. The decrease in RWB can lead to an increase in the number of errors (e.g., bit errors) and/or error rate (e.g., bit error rate (BER)) experienced by the partially functional blocks. Typically, read level optimization, such as, read level adjustment settings are implemented by the memory device to compensate for errors. However, simply implementing additional read level adjustment settings may further complicate the already exhaustive read level adjustment setting implemented by the memory device (e.g., read level adjustment setting based on wordline group, temperature, cycling, block family error avoidance table, etc.).

Aspects of the present disclosure address the above and other deficiencies by providing a memory sub-system that adaptively adjusts a default bitline voltage used to precharge a bitline during a program verify phase to prevent decreases in RWB due to cycling of the memory device. In one embodiment, responsive to receiving a request to perform a program operation on a segment (e.g., a block) of the memory device, the memory sub-system determines whether the block is a fully functional block or a partially functional block. The block may be a set of vertically stacked memory cells. In some embodiments, the memory sub-system maintains a list of addresses associated with partially functional blocks to which the address of the block can be compared. In some embodiments, the memory sub-system determines whether the block is a partially functional block by determining whether at least one memory cell of the set of vertically stacked memory cells of the block is non-programmable (e.g., contains a defective deck).

If the block is a fully functional block, the memory sub-system uses, during the program verify phase, the default bitline voltage. Responsive to determining that the block is a partially functional block, the memory sub-system may further determine a type of partially functional block. Depending on the embodiment, in a two-deck memory device, the type of partially functional block may be one of an upper deck functional block (also referred to as a top half good block) or a lower deck functional block (also referred to as a bottom half good block). The upper deck functional block may be a block in which a top memory cell of the set of vertically stacked memory cells of the block is programmable while the bottom memory cell of the set of vertically stacked memory cells of the block is non-programmable. The lower deck functional block may be a block in which a bottom memory cell of the set of vertically stacked memory cells of the block is programmable while the top memory cell of the set of vertically stacked memory cells of the block is non-programmable.

Responsive to determining that the partially functional block is a lower deck functional block, the memory sub-system determines a number of PECs of the memory device. Based on the number of PECs of the memory device, the memory sub-system determines a bitline voltage adjustment value to adjust the default bitline voltage. In particular, the memory sub-system may obtain, from a bitline voltage adjustment data structure, the bitline voltage adjustment value. The bitline voltage adjustment data structure may include a plurality of entries. Each entry of the bitline voltage adjustment data structure is associated with a logical state of the memory cell to be programmed and includes a bitline voltage adjustment value for one or more number of PECs. Each bitline voltage adjustment value is based on the logical state of the memory cell to be programmed and the number of PECs experienced by the memory device. Each bitline voltage adjustment value at a respective logical level and respective number of PECs is used to adjust the default bitline voltage during a program verify phase to compensate for a potential read error during a read operation. Thus, an adjusted bitline voltage based on the default bitline voltage adjusted by the bitline voltage adjustment value is applied during a program verify phase of the lower deck functional block. Accordingly, responsive to receiving a request to perform a read operation on the lower deck functional block, the memory sub-system, similar to a fully functional block, performs the read operation using the default bitline voltage.

Advantages of the present disclosure include, but are not limited to, improving memory device performance and reliability by adjusting a bitline voltage during a program verify phase of a program operation of a partially functional block without contributing the complexity of read level optimization.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a program verify (PV) setting adjustment component 113 that can dynamically adjust a default bitline voltage used during a program verify phase of a program operation on a partially functional block. In some embodiments, the memory sub-system controller 115 includes at least a portion of the PV setting adjustment component 113. In some embodiments, the PV setting adjustment component 113 is part of the host system 120, an application, or an operating system. In other embodiments, local media controller 135 includes at least a portion of PV setting adjustment component 113 and is configured to perform the functionality described herein.

The PV setting adjustment component 113 receives a request to perform a program operation on a block of the memory device 130 and/or 140. The PV setting adjustment component 113 determines whether the block is a fully functional block or a partially functional block. As previously noted, the block is a set of vertically stacked memory cells. Thus, a fully functional block is a block in which each memory cell of the set of vertically stacked memory cells are programmable and a partially functional block is a block in which at least one memory cell of the set of vertically stacked memory cells is non-programmable. If the PV setting adjustment component 113 determines that the block is a fully functional block, a default bitline voltage is used during a program verify phase on the block.

If the PV setting adjustment component 113 determines that the block is a partially functional block, the PV setting adjustment component 113 further determines a type of partially functional block. As previously noted, the partially functional block, in a two-deck memory device for example, may be one of an upper deck functional block or a lower deck functional block. The upper deck functional block may be a block in which a top memory cell of the set of vertically stacked memory cells of the block is programmable while the bottom memory cell of the set of vertically stacked memory cells of the block is non-programmable. The lower deck functional block may be a block in which a bottom memory cell of the set of vertically stacked memory cells of the block is programmable while the top memory cell of the set of vertically stacked memory cells of the block is non-programmable.

If the PV setting adjustment component 113 determines that the type of partially functional block is an upper deck functional block, a default bitline voltage is used during a program verify phase on the block. Otherwise, if the PV setting adjustment component 113 determines that the type of partially functional block is a lower deck functional block, the PV setting adjustment component 113 determines a bitline voltage adjustment value. The bitline voltage adjustment value is determined based on a logical state of the memory cell of the set of vertically stacked memory cells that is programmable and a number of program erase cycles (PECs). In particular, the PV setting adjustment component 113 identifies an entry of a bitline voltage adjustment data structure containing the bitline voltage adjustment value. The bitline voltage adjustment data structure includes a plurality of entries. Each entry of the bitline voltage adjustment data structure corresponds with (e.g., accessed using) a logical state of the programmed memory cell of the set of vertically stacked memory cells at a respective number of PECs of the memory device 130 and/or 140. Once the bitline voltage adjustment value is obtained based on the logical state of the memory cell to be programmed and the current number of PECs of the memory device 130 and/or 140, the PV setting adjustment component 113 adjusts the default bitline voltage by the obtained bitline voltage adjustment value (e.g., an adjusted bitline voltage). The PV setting adjustment component 113 then uses the adjusted bitline voltage during a program verify phase on the block.

In particular, the program verify phase applies a ramped voltage to the selected wordline associated with the memory cell being verified, while biasing unselected wordlines associated with the memory cell with a pass-through voltage. When the ramped voltage reaches the threshold voltage to which the memory cell has been programmed, the memory cell turns on and allowing a sense circuit (not shown) coupled to a bitline of the memory cell to facilitate performing a sense operation (e.g., read and/or verify) on the memory cell.

The sense operation may precharge a sense node of the sense circuit, with a program verify level to facilitate sensing, by the sense node, a designated voltage level. In particular, the sense operation biases, using the program verify level, a transistor between a supply voltage and a sense node to inject a precharge current into the sense node. The sense operation may further precharge the bitline of the memory cell by applying, to a transistor coupled between the bitline and the sense node, an adjusted bitline voltage set by the PV setting adjustment component 113 to the bitline. At a given sensing time (e.g., sense time), the sense operation senses, based on a discharge of the sense node and the adjusted bitline voltage, a threshold voltage of the memory cell. Based on the sensed threshold voltage of the memory cell, further programming is either inhibited if the sensed threshold voltage achieved a target threshold voltage to prevent further programming of the memory cell or continued to achieve the target threshold voltage.

In some embodiments, the sensed threshold voltage of the memory cell at the adjusted bitline voltage may be lower than the sensed threshold voltage at a default bitline voltage as a result of the adjusted bitline voltage being larger than the default bitline voltage causing the sense node to discharge much quicker. In other embodiments, the sensed threshold voltage of the memory cell at the adjusted bitline voltage may be higher than the sensed threshold voltage at a default bitline voltage as a result of the adjusted bitline voltage being smaller than the default bitline voltage causing the sense node to discharge much slower.

After programming of the memory cell and responsive to a request to read the memory cell (e.g., a read operation on the block), a default bitline voltage is used regardless of whether a default bitline voltage or an adjusted bitline voltage was used during the program verify phase. Thus, the read operation can result in an accurate read without read level adjustment. Further details with regards to the operations of the PV setting adjustment component 113 are described below.

Figure 2:
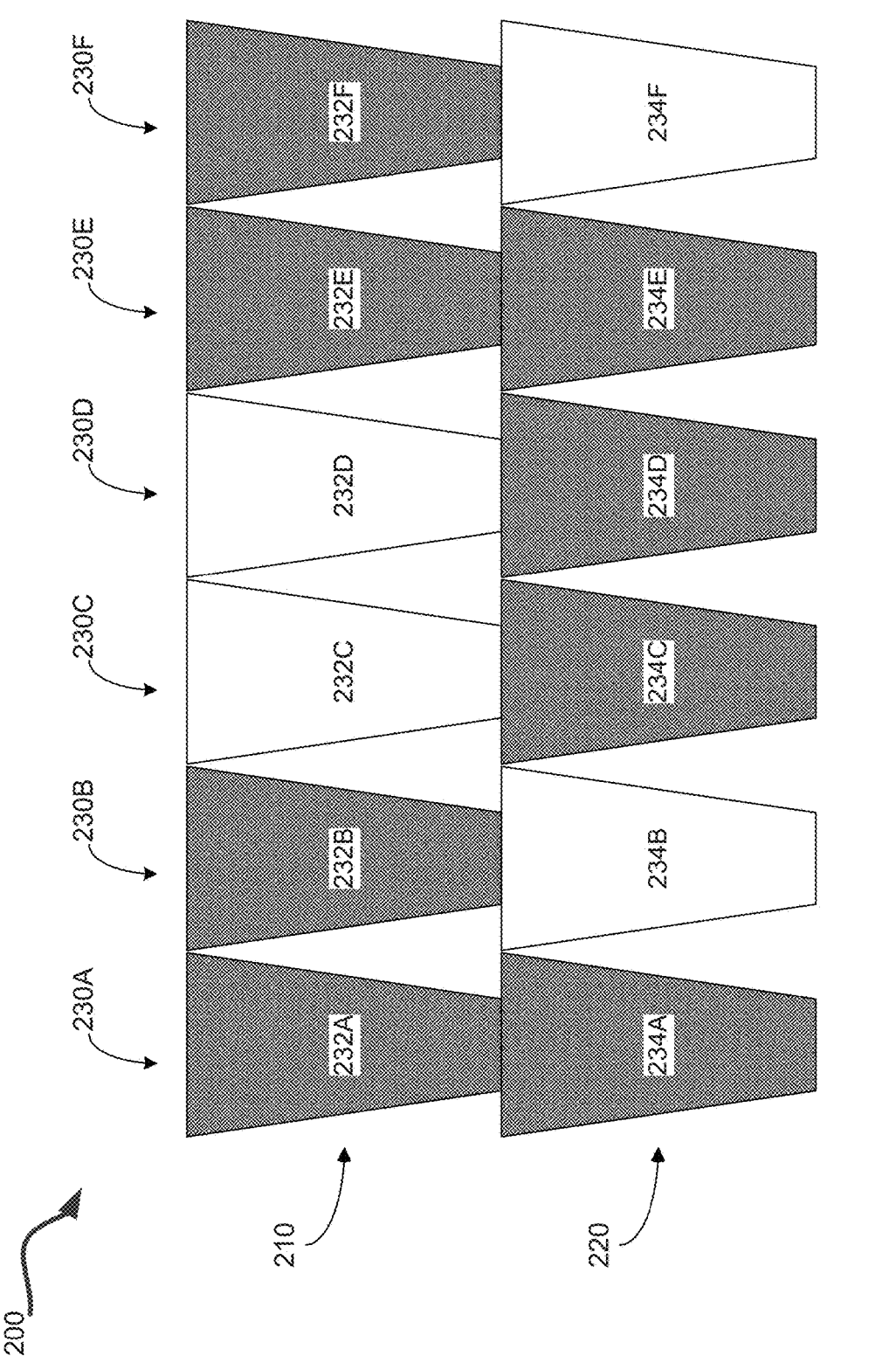
FIG. 2 illustrates an example of a logical block, in accordance with some embodiments of the present disclosure.

FIG. 2 illustrates an example of a logical block 200, in accordance with some embodiments of the present disclosure. The logical block 200 is addressable by a block address and includes multiple physical blocks (e.g., physical blocks 230A-F). Each physical block is located on a plane of the memory device. The plane of the memory device includes two two-dimensional (2D) array of memory cells (e.g., memory arrays) stacked on top of one another. Each memory array constitutes a layer or deck of the memory device. Each deck (e.g., 232A-F and 234A-F) is electronically addressable by a wordline (e.g., 210 or 220). Depending on the embodiment, each plane of the memory device may include any number of memory arrays (e.g., decks). Accordingly, each deck of a physical block is addressable by a bitline of the physical block (e.g., a bitline of physical block 230A) and the wordline of the deck (e.g., wordline 210 associated with deck 232A of physical block 230A or wordline 220 associated with deck 234A of physical block 230A).

Each deck of the physical block may be used to store data (e.g., physical blocks 230A and physical blocks 230E). The physical blocks in which each deck of the physical block is usable may be categorized as a fully functional block. In some embodiments, a wordline (e.g., wordline 220) associated with a deck of a physical block (e.g., deck 234B of physical block 230B) may degrade or experience failure, thereby rendering the deck unable to store data (e.g., unusable). Thus, the other deck(s) of the physical block (e.g., deck 234B of physical block 230B) may still be able to store data (e.g., usable). The physical blocks in which one deck of the physical block is usable and the other deck of the physical block is unusable may be categorized as a partially functional block.

Depending on the placement of the usable deck of the physical blocks, the partially functional block may be further categorized as an upper deck functional block or a lower deck functional block. For example, the deck(s) associated with wordline 210 (e.g., deck 232B or deck 232F) is usable while the deck(s) associated with wordline 220 (e.g., deck 234B or deck 234F) is unusable, the physical block (e.g., physical block 230B or physical block 230F) is categorized as an upper deck functional block. In another example, the deck(s) associated with wordline 210 (e.g., deck 232C or 232D) is unusable while the deck(s) associated with wordline 220 (e.g., deck 234C or 234D) is usable, the physical block (e.g., physical block 230C or physical block 230D) is categorized as a lower deck functional block.

FIG. 3 illustrates an example of a bitline voltage adjustment data structure (e.g., table) 200 that provides bitline voltage adjustment values used to adjust a default bitline voltage, in accordance with some embodiments of the present disclosure. In one embodiment, the bitline voltage adjustment data structure 300 is stored in the local memory 119 of the memory sub-system 110. The bitline voltage adjustment data structure 300 includes multiple rows identified by a logical state(s) 310 (e.g., eight levels for TLC memory: L0-L7). Each of the logical state(s) 310 corresponds a respective $V_T$ level. In other embodiments, where other types of memory are used, the bitline voltage adjustment data structure 300 can have some other number of logical states (e.g., 16 levels for QLC memory: L0-L15). The bitline voltage adjustment data structure 300 includes multiple columns (e.g., 320A-H) each identified by a number of program erase cycles (PECs). Each of the columns (e.g., 320A-H) corresponds to a number of cycles experienced by the memory device from the beginning of life of the memory device. Each entry of the bitline voltage adjustment data structure 300 identified by one of the logical state(s) 310 and one of the number of PECs (e.g., 320A-H) includes a bitline voltage adjustment value (e.g., BVAV0-50) used to adjust a default bitline voltage. In particular, the entry indicates a bitline voltage adjustment value (e.g., BVAV) at the number of PECs (or within a predetermined range of the number of PECs) necessary to adjust the default bitline voltage used during a program verify phase to prevent errors of the memory cell at the logical state during the read operation.

FIG. 4 is a flow diagram of an example method 400 of adjusting the default bitline voltage during a program operation, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the PV setting adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic receives a request to perform a program operation on a set of vertically stacked memory cells of a memory device. The set of vertically stacked memory cells may be a block of the memory device and each memory cell of the set of vertically stacked memory cells is addressable by a respective wordline. As previously described, the program operation may include a programming phase and a program verify phase. In particular, during the programming phase, a memory cell is programmed to a desired programming level (e.g., logical state) and, during the program verify phase, a determination is made regarding whether the threshold voltage has increased to the desired programming level.

At operation 420, responsive to determining that at least one memory cell of the set of vertically stacked memory cells is non-programmable, the processing logic determines, based on a number of program erase cycles (PECs) associated with the memory device, a bitline voltage adjustment value. To determine that at least one memory cell of the set of vertically stacked memory cells is non-programmable, the processing logic identifies whether a wordline associated with the at least one memory cell of the set of vertically stacked memory cells is defective.

As previously described, the memory device may include multiple decks stacked vertically. Each set of vertically stacked memory cells may include multiple functional decks (e.g., each of the set of vertically stacked memory cells are functional) also referred to as a fully functional block or at least one non-functional deck (e.g., at least one memory cell of the set of vertically stacked memory cells is non-functional) also referred to as a partially functional block. In some embodiment, responsive to determining that each memory cell of the set of vertically stacked memory cells is programmable (e.g., a fully functional block), the processing logic performs, using the default bitline voltage, the program operation on the set of vertically stacked memory cells.

As previously described, after determining that at least one memory cell of the set of vertically stacked memory cells is non-programmable (or a partially functional block), the processing logic determines a type of partially functional block. For example, in a two-deck memory device, the type of partially functional block may be one of: an upper deck functional block or a lower deck functional block. The upper deck functional block may be a set of vertically stacked memory cells in which a top memory cell of the set of vertically stacked memory cells is programmable while the bottom memory cell of the set of vertically stacked memory cells is non-programmable. The lower deck functional block may be a set of vertically stacked memory cells in which a bottom memory cell of the set of vertically stacked memory cells is programmable while the top memory cell of the set of vertically stacked memory cells is non-programmable.

The processing logic determines the bitline voltage adjustment value by identifying, for a given memory cell of the set of vertically stacked memory cells, an entry including the bitline voltage adjustment value associated with a logical state of the given memory cell and the number of PECs from a plurality of entries in a bitline voltage adjustment data structure. In some embodiments, the given memory cell of the set of vertically stacked memory cells is bottom memory cell of the set of vertically stacked memory cells (e.g., a memory cell from the lower deck functional block). Each entry of the plurality of entries is identified by a respective bitline voltage adjustment value associated with a logical state and a respective number of PECs.

At operation 430, the processing logic adjusts a default bitline voltage by the bitline voltage adjustment value to generate an adjusted bitline voltage. In some embodiments, the processing logic the processing logic adjusts the default bitline voltage by adding the bitline voltage adjustment value to the default bitline voltage. Depending on the embodiment, the bitline voltage adjustment value may be a positive offset value or a negative offset value. In other embodiments, the processing logic the processing logic adjusts the default bitline voltage by subtracting the bitline voltage adjustment value from the default bitline voltage.

At operation 430, the processing logic performs, using the adjusted bitline voltage, the program operation on the set of vertically stacked memory cells. In particular, the processing logic performs the program operation on the set of vertically stacked memory cells by applying the adjusted bitline voltage to the set of vertically stacked memory cells during a program verify phase associated with the program operation. Depending on the embodiment, the processing logic performs, using the default bitline voltage, a read operation on the set of vertically stacked memory cells.

FIG. 5 is a flow diagram of an example method 500 to adjusting the default bitline voltage during a program operation, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the PV setting adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic receives a request to perform a program operation on a block of a memory device. The block may include a non-programmable top deck and a programmable bottom deck. As previously described, the memory device may include multiple decks stacked vertically. Each set of vertically stacked memory cells may include multiple functional decks (e.g., a fully functional block) or at least one non-functional deck (e.g., a partially functional block). The partially functional block may be one of: an upper deck functional block (e.g., a non-programmable bottom deck and a programmable top deck) or a lower deck functional block (e.g., a non-programmable top deck and a programmable bottom deck). In some embodiment, responsive to determining that the first block is a fully functional block, the processing logic performs, using the default bitline voltage, the program operation on the set of vertically stacked memory cells.

At operation 520, the processing logic performs, using an adjusted bitline voltage, a program verify phase on the first block. The processing logic determines the bitline voltage adjustment value by identifying, for a functional deck (e.g., a bottom memory cell of the lower functional block), an entry including the bitline voltage adjustment value associated with a logical state of the functional deck and the number of PECs from a plurality of entries in a bitline voltage adjustment data structure. Each entry of the plurality of entries is identified by a respective bitline voltage adjustment value associated with a logical state and a respective number of PECs.

In some embodiments, the processing logic receives a request to perform a program operation on a second block of the memory device. The second block includes a programmable top deck and a non-programmable bottom deck (e.g., an upper functional block). The processing logic, as a result, performs a program verify phase on the second block using a default bitline voltage. Depending on the embodiment, once the block (e.g., first or second block) is programmed, the processing logic performs, using the default bitline voltage, a read operation on the block.

Figure 6:
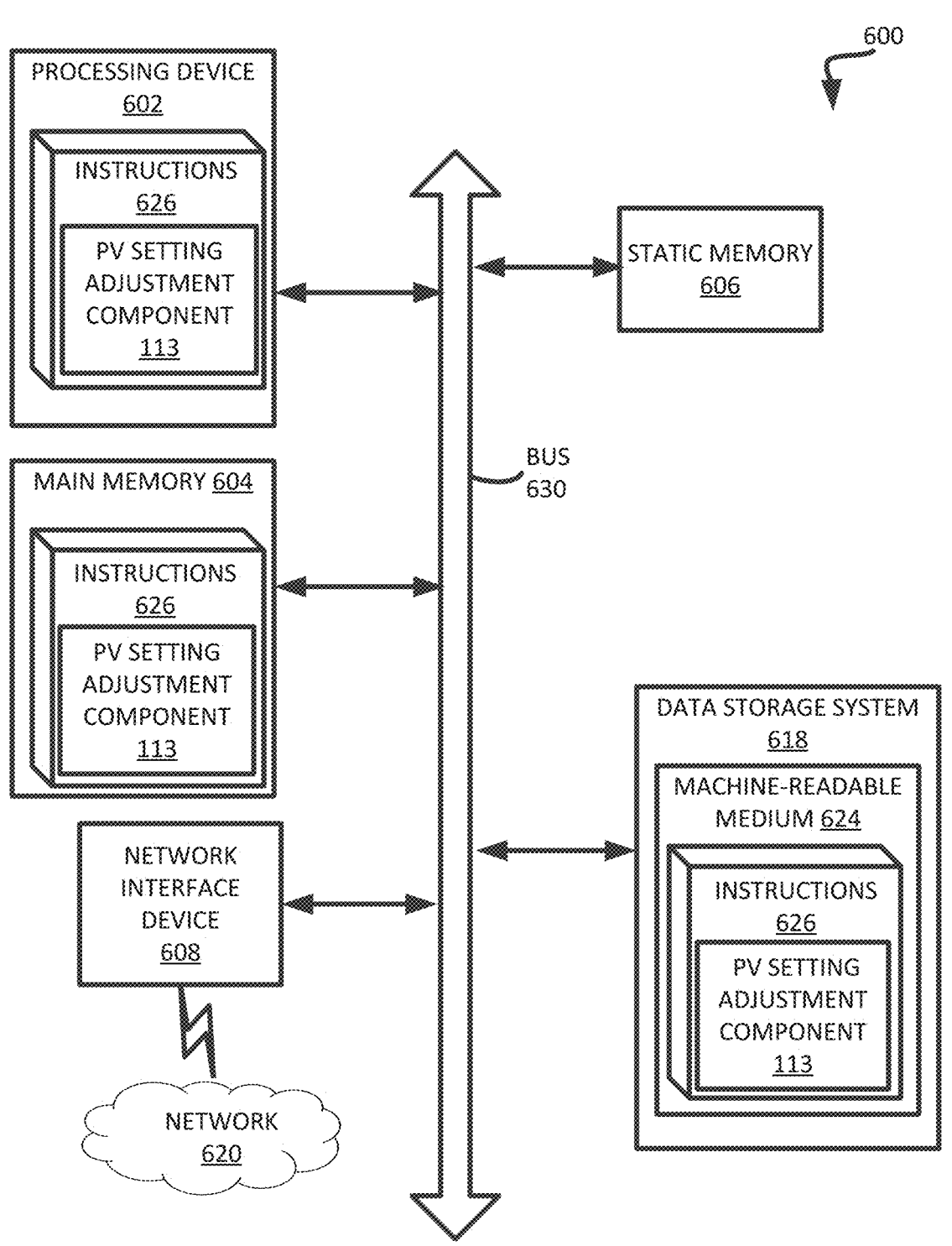
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the PV setting adjustment component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a PV setting adjustment component (e.g., the PV setting adjustment component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:

receiving a request to perform a program operation on a set of vertically stacked memory cells of a memory device, wherein each memory cell of the set of vertically stacked memory cells is addressable by a respective wordline;

determining whether at least one memory cell of the set of vertically stacked memory cells is non-programmable due to degradation;

responsive to determining that at least one memory cell of the set of vertically stacked memory cells is non-programmable due to degradation, determining, based on a logical state of the remaining memory cells of the set of vertically stacked memory cells that are programmable and a number of program erase cycles (PECs) associated with the memory device, a bitline voltage adjustment value;

adjusting a default bitline voltage by the bitline voltage adjustment value to generate an adjusted bitline voltage; and performing, using the adjusted bitline voltage, the program operation on the set of vertically stacked memory cells.

2. The method of claim 1, wherein determining that at least one memory cell of the set of vertically stacked memory cells is non-programmable comprises:

identifying whether a wordline associated with the at least one memory cell of the set of vertically stacked memory cells is defective.

3. The method of claim 1, wherein performing the program operation on the set of vertically stacked memory cells comprises:

applying the adjusted bitline voltage to the bitline associated with the set of vertically stacked memory cells during a program verify phase of the program operation.

4. The method of claim 1, wherein determining the bitline voltage adjustment value further comprises:

for a given memory cell of the set of vertically stacked memory cells, identifying, from a plurality of entries in a bitline voltage adjustment data structure, an entry associated with a programming level of the given memory cell and the number of PECs, the entry comprising the bitline voltage adjustment value, wherein each entry of the plurality of entries comprises a respective bitline voltage adjustment value associated with a different programming level and a respective number of PECs.

5. The method of claim 1, wherein the set of vertically stacked memory cells is a block of the memory device.

6. The method of claim 1, wherein the at least one memory cell of the set of vertically stacked memory cells that is non-programmable is a memory cell at a top of the set of vertically stacked memory cells.

7. The method of claim 1, further comprising:

performing a read operation on the set of vertically stacked memory cells.

8. The method of claim 1, further comprising:

responsive to determining that each memory cell of the set of vertically stacked memory cells is programmable, performing, using a default bitline voltage, the program operation on the set of vertically stacked memory cells.

9. A system comprising:

a memory device; and a processing device, operatively coupled to the memory device, the processing device to perform operations comprising:

receiving a request to perform a program operation on a set of vertically stacked memory cells of the memory device, wherein each memory cell of the set of vertically stacked memory cells is addressable by a respective wordline;

determining whether at least one memory cell of the set of vertically stacked memory cells is non-programmable due to degradation;

responsive to determining that at least one memory cell of the set of vertically stacked memory cells is non-programmable due to degradation, determining, based on a logical state of the remaining memory cells of the set of vertically stacked memory cells that are programmable and a number of program erase cycles (PECs) associated with the memory device, a bitline voltage adjustment value;

adjusting a default bitline voltage by the bitline voltage adjustment value to generate an adjusted bitline voltage; and performing, using the adjusted bitline voltage, the program operation on the set of vertically stacked memory cells.

10. The system of claim 9, wherein determining that at least one memory cell of the set of vertically stacked memory cells is non-programmable comprises:

identifying whether a wordline associated with the at least one memory cell of the set of vertically stacked memory cells is defective.

11. The system of claim 9, wherein performing the program operation on the set of vertically stacked memory cells comprises:

applying the adjusted bitline voltage to the bitline associated with the set of vertically stacked memory cells during a program verify phase of the program operation.

12. The system of claim 9, wherein determining the bitline voltage adjustment value further comprises:

for a given memory cell of the set of vertically stacked memory cells, identifying, from a plurality of entries in a bitline voltage adjustment data structure, an entry associated with a programming level of the given memory cell and the number of PECs, the entry comprising the bitline voltage adjustment value, wherein each entry of the plurality of entries comprises a respective bitline voltage adjustment value associated with a different programming level and a respective number of PECs.

13. The system of claim 9, wherein the set of vertically stacked memory cells is a block of the memory device.

14. The system of claim 9, wherein the at least one memory cell of the set of vertically stacked memory cells that is non-programmable is a memory cell at a top of the set of vertically stacked memory cells.

15. The system of claim 9, wherein the processing device is to perform further operations comprising:

performing a read operation on the set of vertically stacked memory cells.

16. The system of claim 9, wherein the processing device is to perform further operations comprising:

responsive to determining that each memory cell of the set of vertically stacked memory cells is programmable, performing, using a default bitline voltage, the program operation on the set of vertically stacked memory cells.

17. A non-transitory computer readable storage medium including instructions that, when executed by a processing device, cause the processing device to perform operations comprising:

receiving a request to perform a program operation on a first block of a memory device, wherein the first block includes a non-programmable top deck due to degradation of at least one memory cell of a top deck of the first block and a programmable bottom deck; and performing, using an adjusted bitline voltage, the program operation on the first block, wherein the adjusted bitline voltage is determined based on a logical state of a given memory cell of the programmable bottom deck and a number of program erase cycles (PECs) of the memory device.

18. The non-transitory computer readable storage medium of claim 17, wherein performing the program operations comprises:

determining the number of program erase cycles (PECs) of the memory device; and for the given memory cell of the first block, identifying, from a plurality of entries in a bitline voltage adjustment data structure, an entry associated with a programming level of the given memory cell and the number of PECs, the entry comprising a bitline voltage adjustment value, wherein each entry of the plurality of entries comprises a respective bitline voltage adjustment value associated with a different programming level and a respective number of PECs.

19. The non-transitory computer readable storage medium of claim 17, wherein the instructions cause the processing device to perform operations further comprising:

responsive to receiving a request to perform a read operation on the first block, performing a read operation on the first block.

20. The non-transitory computer readable storage medium of claim 17, wherein the instructions cause the processing device to perform operations further comprising:

receiving a request to perform a program operation on a second block of the memory device, wherein the second block includes a programmable top deck and a non-programmable bottom deck; and performing, using a default bitline voltage, a read operation on the second block.

* * * * *